(12) United States Patent
Zhuang

(10) Patent No.: US 8,461,896 B2
(45) Date of Patent: Jun. 11, 2013

(54) COMPENSATING FOR WANDER IN AC COUPLING DATA INTERFACE

(75) Inventor: Jingcheng Zhuang, Allen, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 68 days.

(21) Appl. No.: 13/155,720

(22) Filed: Jun. 8, 2011

(65) Prior Publication Data

US 2012/0133414 A1 May 31, 2012

Related U.S. Application Data

(60) Provisional application No. 61/417,749, filed on Nov. 29, 2010.

(51) Int. Cl.
*H03L 5/00* (2006.01)

(52) U.S. Cl.
USPC ............ 327/307; 375/317; 375/319; 375/233

(58) Field of Classification Search
None
See application file for complete search history.

(56) References Cited

U.S. PATENT DOCUMENTS

| | | | |
|---|---|---|---|
| 7,330,320 B1 | 2/2008 | Oberg et al. | |
| 7,679,853 B2 | 3/2010 | Song et al. | |
| 7,720,141 B2 | 5/2010 | Fang et al. | |
| 2008/0057900 A1* | 3/2008 | Fang et al. | 455/296 |
| 2008/0063091 A1* | 3/2008 | Dong et al. | 375/257 |
| 2010/0157464 A1 | 6/2010 | Mathew et al. | |
| 2012/0133459 A1 | 5/2012 | Zhuang et al. | |

* cited by examiner

*Primary Examiner* — Jany Richardson

(57) ABSTRACT

Techniques are disclosed relating to reducing wander created by AC couplers. In one embodiment, an integrated circuit is disclosed that includes an AC coupler and a DC-level shifter. The AC coupler is configured to receive a differential input signal at first and second nodes, and to shift a common-mode voltage of the differential input signal. The DC-level shifter is coupled to the first and second nodes, and configured to reduce wander of the AC coupler. In various embodiments, the DC-level shifter is configured to supply a differential reference signal to the AC coupler, and to create the differential reference signal from the differential input signal at the first and second nodes by changing a common-mode voltage of the differential input signal.

21 Claims, 9 Drawing Sheets

COMPENSATING FOR WANDER IN AC COUPLING DATA INTERFACE

RELATED APPLICATION

The present application claims the benefit of priority to U.S. Provisional Application No. 61/417,749, filed Nov. 29, 2010, the disclosure of which is incorporated by reference herein in its entirety.

BACKGROUND

1. Technical Field

This disclosure relates generally to integrated circuits, and, more specifically, to analog signal processing performed by receivers.

2. Description of the Related Art

Digital receivers typically have an analog frontend that is configured to process a received signal so that it can be sampled for use by a digital backend. As a signal passes through a channel, the channel may introduce noise into the signal that causes inter-symbol interference. Analog frontends may use a variety of techniques to reduce such interference to improve symbol recovery.

In many instances, an analog frontend may amplify a received signal prior to sampling it to improve symbol recovery. In some instance, an analog frontend may use an amplifier that is configured to amplify a difference of two signals about a common-mode voltage supported by the amplifier. To ensure that the received signals have the supported common-mode voltage, the analog frontend may use an AC coupler to shift the common-mode voltage of the received signals to the common-mode voltage supported by the amplifier.

SUMMARY OF EMBODIMENTS

The present disclosure describes various embodiments of structures and methods to compensate for wander produced by AC couplers.

In one embodiment, an integrated circuit is disclosed. The integrated circuit includes an AC coupler and a DC-level shifter. The AC coupler is configured to receive a differential input signal at first and second nodes, and to shift a common-mode voltage of the differential input signal. The DC-level shifter is coupled to the first and second nodes, and is configured to reduce wander of the AC coupler. In some embodiments, the DC-level shifter is configured to supply a differential reference signal to the AC coupler. The DC-level shifter is configured to create the differential reference signal from the differential input signal at the first and second nodes by changing a common-mode voltage of the differential input signal.

In one embodiment, an apparatus is disclosed. The apparatus includes a receiver configured to use an AC coupler to high-pass filter a differential input signal. The receiver is configured to compensate for wander of the AC coupler by adding a filtered differential reference signal to the high-pass-filtered differential input signal to produce a differential output signal. In some embodiments, the receiver is configured to create the filtered differential reference signal by shifting a common-mode voltage of the differential input signal and low-pass filtering the differential input signal.

In one embodiment, a method is disclosed. The method includes an AC coupler of a receiver high-pass filtering a differential input signal. The method further includes the receiver reducing wander created by the AC coupler by adding, to the high-pass-filtered differential input signal, a low-pass-filtered form of the differential input signal that has a shifted common-mode voltage. In some embodiments, the method includes a resistor divider network of the receiver shifting the common-mode voltage of the differential input signal to create the low-pass-filtered form of the differential input signal.

In one embodiment, an apparatus is disclosed. The apparatus includes an AC coupler configured to receive a differential input signal at first and second nodes, and to shift a common-mode voltage of a differential input signal. The apparatus further includes a means for reducing wander of the AC coupler. In some embodiments, the apparatus further includes a linear equalizer coupled to the AC coupler, and the linear equalizer is configured to equalize the differential input signal.

In one embodiment, a computer readable storage medium is disclosed. The computer readable storage medium includes a data structure which is operated upon by a program executable on a computer system. The program operates on the data structure to perform a portion of a process to fabricate an integrated circuit including circuitry described by the data structure. The circuitry described by the data structure includes an AC coupler and a DC-level shifter. The AC coupler is configured to receive a differential input signal at first and second nodes, and to shift a common-mode voltage of the differential input signal. The DC-level shifter is coupled to the first and second nodes, and is configured to reduce wander of the AC coupler.

DETAILED DESCRIPTION

Figure 1:
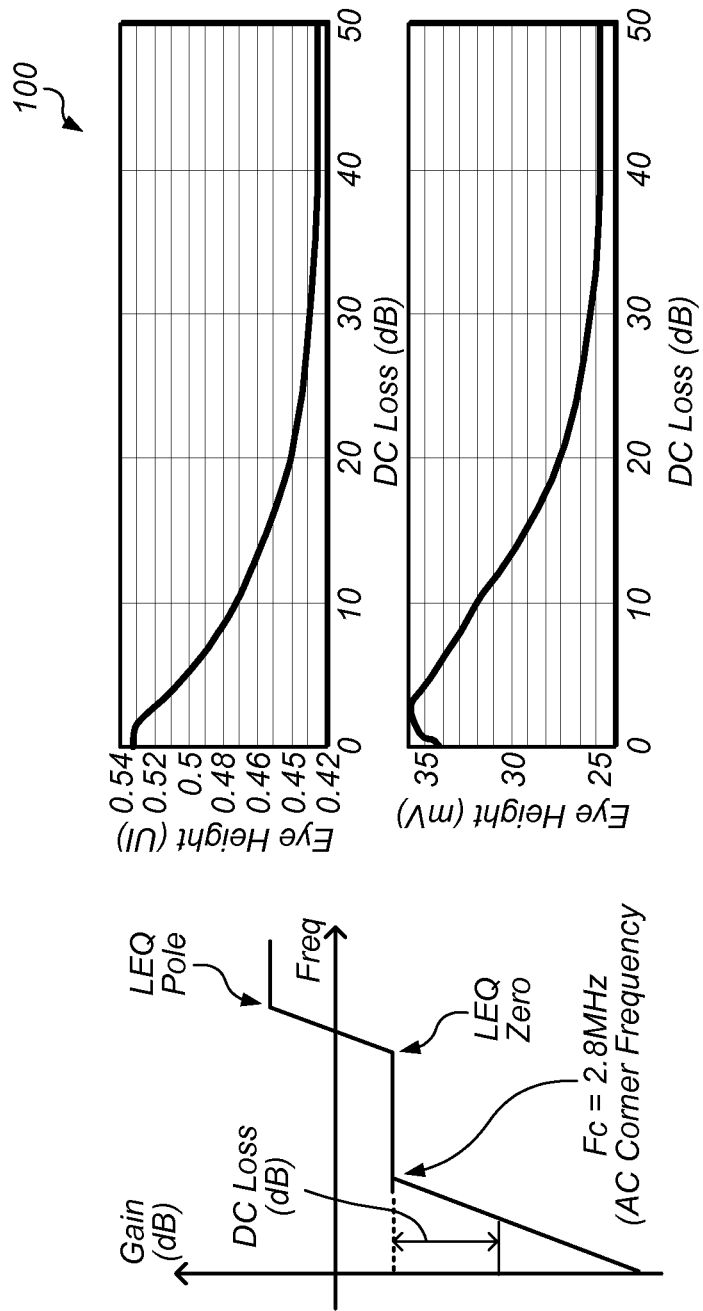
FIG. 1 is a set of exemplary graphs illustrating the effects of DC loss.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware— for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a processor having eight processing elements or cores, the terms "first" and "second" processing elements can be used to refer to any two of the eight processing elements. In other words, the "first" and "second" processing elements are not limited to logical processing elements 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Processor." This term has its ordinary and accepted meaning in the art, and includes a device that is capable of executing instructions. A processor may refer, without limitation, to a central processing unit (CPU), a co-processor, an arithmetic processing unit, a graphics processing unit, a digital signal processor (DSP), etc. A processor may be a superscalar processor with a single or multiple pipelines. A processor may include a single or multiple cores that are each configured to execute instructions.

"Differential Signal." This term has its ordinary and accepted meaning in the art, and includes a signal that is represented using a pair of complementary signals on separate wires (as opposed, for example, to representing a signal on a single wire). A differential signal may be described in terms of its "differential voltage" and its "common-mode voltage."

"Differential Voltage." This term has its ordinary and accepted meaning in the art, and includes a voltage difference between a pairs of wire that are transmitting a differential signal. For example, a differential signal may be transmitted over of a pair of wires having respective voltages of $V_p$ and $V_n$. Thus, the differential voltage of these wires is $V_p-V_n$.

"Common-Mode Voltage." This term has its ordinary and accepted meaning in the art, and includes an average voltage of a pair of wires that are transmitting a differential signal. For example, a differential signal may be transmitted over of a pair of wires having respective voltages of $V_p$ and $V_n$. Thus, the common-mode voltage of these wires is $(V_p+V_n)/2$.

"DC Wander." This term has its ordinary and accepted meaning in the art, and includes random long-term low-frequency variations in a signal. For example, "DC wander" may refer to signal variations that are below 10 Hz. As will be described below, high-pass filtering performed by AC couplers may introduce DC wander in signals.

"Corner Frequency." This term has its ordinary and accepted meaning in the art, and includes the frequency at which a filter begins to significantly attenuate the strength of a signal. For example, a high-pass filter that has a corner frequency of 2 MHz may reduce frequencies below 2 MHz. Similarly, a low-pass filter that has corner frequency of 2 MHz may reduce frequencies above 2 MHz. A corner frequency may also be described as a "cutoff frequency."

An AC coupler may function as a high pass filter that is configured to shift a common-mode voltage of a received signal without consuming extra current and causing signal degradation at high frequencies. A problem with AC couplers is that their high-pass characteristics may introduce baseline wander, which degrades receiver performance because it may introduces low frequency drift in a signal as it is sampled. While this drift may be negligible in some instance, it may create degradation, which is observable, in other instances, as a reduction in a receiver's eye width and eye height. This reduction may complicate symbol recovery.

DC wander may be especially problematic for high-speed receivers that use certain encoding schemes. For example, Peripheral Component Interconnect Express (PCIe) is composed of one or more lanes, which each consists of a pair of transmitting and receiving channels. In PCIe 2.0, these channels operate at a data rate of 5 Gbps and use the 8 b/10 b encoding scheme. In PCIe 3.0, these channels now operate at a faster data rate of 8 Gbps and use the pseudorandom binary sequence (PRBS) 23 encoding scheme. While PCIe 2.0 was more resistant to DC wander created by AC couplers, PCIe 3.0, in some instances, may experience a significant reduction of approximately 20% on eye width and 30% on eye height due to DC wander when the AC corner frequency is 2.8 MHz; this reduction may be worse if the AC corner frequency is higher. To better understand tolerable levels of DC wander, FIG. 1 illustrates an example 100 of how different levels of DC loss affect eye width and eye height. In example 100, the DC loss of 0 dB means a completely DC-coupled characteristic, while a pure AC coupler corresponds to the case of DC loss of +∞dB. A significant performance degradation is observed when DC loss is increased. Based on this figure, it may be desirable, in some instances, to limit the DC loss caused by DC wander to within 0~1 dB so that its impact is negligible.

The present disclosure describes various techniques to reduce wander created by AC couplers. In one embodiment, a receiver is disclosed that includes a DC-level shifter that is configured to compensate for DC wander created by an AC coupler. In one embodiment, the DC-level shifter is configured to reduce the DC wander by providing a differential reference signal to the AC coupler. The DC-level shifter may be configured to create the reference signal from the differential input signal by shifting the common-mode voltage of the differential input signal to produce the reference signal. In some embodiments, the DC-level shifter may also be configured to change the differential voltage of the differential input signal to match a low-frequency gain of a linear equalizer coupled to the AC coupler. In one embodiment, the AC coupler is configured to low-pass filter the reference signal produced by the DC-level shifter and to add this low-pass-filtered signal to a high-pass-filtered form of the differential input signal. The resultant signal produced from this addition, in many instances, has less low-frequency loss than a signal produced without using the DC-level shifter, and thus experiences less DC wander.

In some instances, embodiments of the receiver described herein may be particularly beneficial for high-speed applications or applications that use certain encoding schemes (such as those that do not produce highly DC-balanced data). (Embodiments of the receiver may also be beneficial for receivers that do not use those features.) In various embodiments, the receiver may have advantages of low power consumption, high bandwidth, and no need for calibration or compensation. In some embodiments, the receiver may also be highly linear due to the usage of passive and linear devices.

Figure 2:
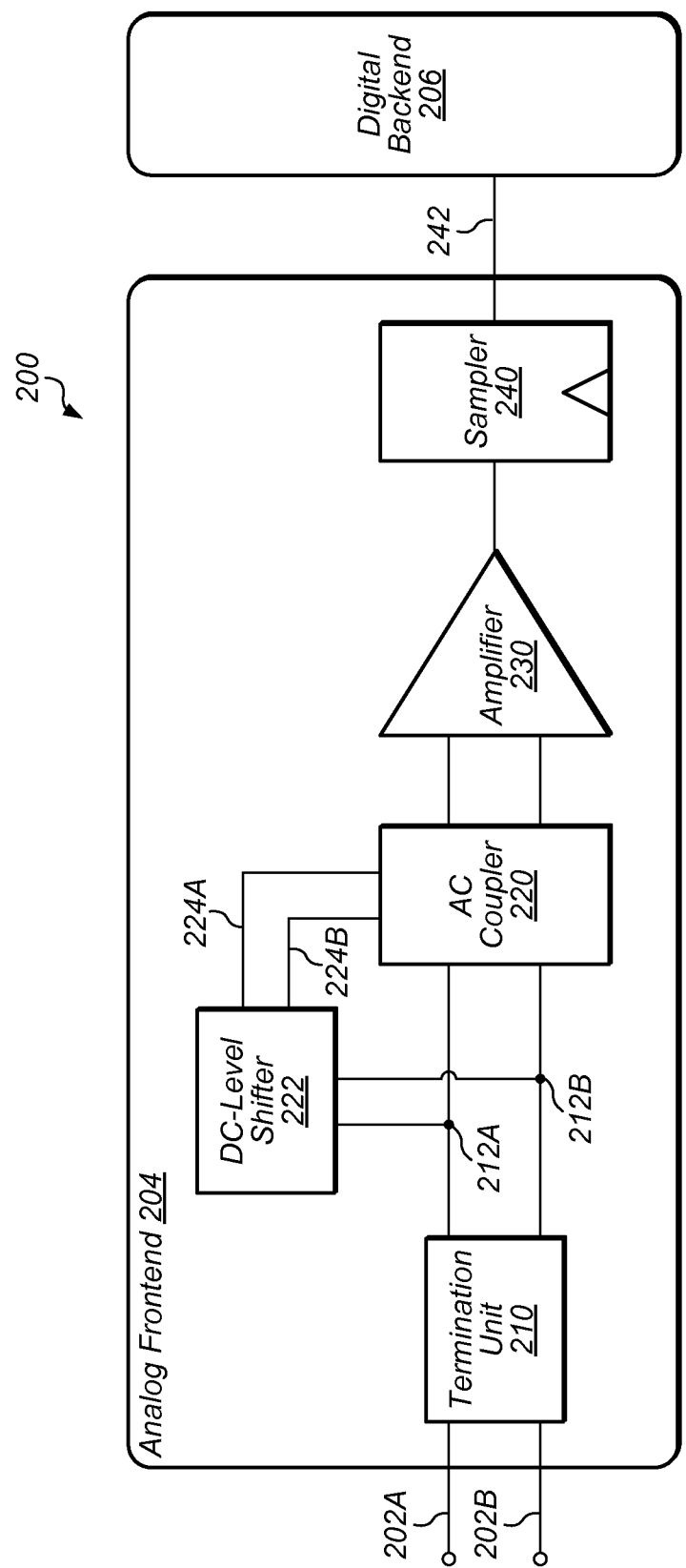
FIG. 2 is a block diagram illustrating one embodiment of a receiver configured to reduce DC wander caused by an AC coupler.

Turning now to FIG. 2, a block diagram of receiver 200 is depicted. Receiver 200 is one embodiment of a receiver that is configured to reduce DC wander produced by an AC coupler. Receiver 200 may be used in any suitable applications that use AC couplers. In some embodiments, receiver 200 may be used in high-speed bus applications. For example, in some embodiments, receiver 200 may be configured to implement a PCI Express standard, a Hyper-Transport standard, etc. Receiver 200 may be implemented using any suitable integrated circuits. For example, in some embodiments, receiver 200 may be implemented in a processor, such a central processing unit (CPU), a co-processor, an arithmetic processing unit, a graphics processing unit, a digital signal processor (DSP), etc. In some embodiments, receiver 200 may be implemented in a field-programmable gate array (FPGA). In some embodiments, receiver 200 may be implemented in an application-specific integrated circuit (ASIC).

In the illustrated embodiment, receiver 200 includes an analog frontend 204 and a digital backend 206. Analog frontend 204 is one embodiment of circuitry that is configured to process an analog input signal to create a digital signal. In the illustrated embodiment, analog frontend 204 is configured to receive a differential input signal via lines 202 and to provide a digital signal to digital backend 206 via line 242. Analog frontend 204 includes a termination unit 210, AC coupler 220, DC-level shifter 222, amplifier 230, and sampler 240. In some embodiments, analog frontend 204 may include additional filters, equalizers, amplifiers, samplers, etc. In some embodiments, analog frontend 204 may include a linear equalizer described in conjunction with FIGS. 7A and 7B. Digital backend 206 is one embodiment of circuitry that is configured to process a digital signal to recover transmitted symbols. In various embodiments, digital backend 206 may include logic that is configured to digitally filter signal 242, decode signal 242, etc.

Termination unit 210, in one embodiment is configured to ensure that a differential signal received via lines 202 has a correct input impedance to reduce channel reflection. In one embodiment, termination unit 210 includes a pair of resistors that are each coupled to ground and one of lines 202. In other embodiments, termination unit 210 may be configured differently. In the illustrated embodiment, termination unit 210 is coupled to AC coupler 220 and DC-level shifter 222 via nodes 212A and 212B. As used herein, nodes 212A and 212B may be referred to herein as "first and second nodes."

AC coupler 220, in one embodiment, is configured to shift a common-mode voltage of the differential input signal. To shift the common-mode voltage, AC coupler 220, in one embodiment, is configured to high-pass filter the differential input signal and to add a filtered reference signal to the high-pass-filtered differential input signal to produce a differential output signal that has the shifted common-mode voltage. In various embodiments, the common-mode voltage of the output signal is a common-mode voltage supported by amplifier 230. As discussed above, the high-pass filtering performed by an AC coupler can cause a signal to experience DC wander, which may cause a reduction in eye width and eye height for a receiver. AC coupler 220 is described in further detail below in conjunction with FIG. 3.

DC-level shifter 222, in one embodiment, is configured to reduce DC wander of AC coupler 220. In one embodiment, DC-level shifter 222 is configured to reduce the wander by supplying a differential reference signal via lines 224A and 224B. In various embodiments, DC-level shifter 222 is configured to create the differential reference signal from the differential input signal at nodes 212. In one embodiment, DC-level shifter 222 is configured to change a common-mode voltage of the differential input signal to create the reference signal. In one embodiment, DC-level shifter 222 is also configured to adjust the differential voltage of the differential input signal to create the reference signal. In some embodiments, DC-level shifter 222 may be configured to adjust the differential voltage so that the gain of DC-level shifter 222 matches (i.e., is equivalent to) the low-frequency gain (i.e., $K_{LF}$ described below and may be the gain in the frequency range between an AC corner frequency and equalization zero, e.g., as shown FIG. 7B) of a linear equalizer coupled to AC coupler 220 (e.g., linear equalizer 710 described below in conjunction with FIG. 7). In one embodiment, AC coupler 220 is configured to low-pass filter the reference signal received via lines 224 and to add the filtered reference signal to a high-pass-filtered form of the differential input signal. This addition of the reference signal compensates for the low-frequency loss created by the high-pass filtering performed by AC-coupler 230.

In various embodiments, the path from nodes 212 through DC-level shifter 222, lines 224, and AC coupler 220 may be described herein as a feedforward path since the reference signal produced by DC-level shifter 222 is not generated based on subsequent processing of the differential input signal, e.g., performed by elements 230 and 240 or digital backend 206. Thus, the path does not rely on clock and data recovery (e.g., performed by a digital backend), so DC wander compensation can be enabled at any time; in contrast, a decision feedback restore (DFR) system that relies upon a feedback loop may be enabled only after the clock and data are properly recovered, which can be affected by error propagation and feedback stability. In some embodiments, the path can potentially achieve lower power consumption, and may occupy less area than a DFR system by using less logic than a feedback path used in DFR. DC-level shifter 222 is described in further detail below in conjunction with FIGS. 4-6. DC-level shifter 222 and its corresponding structural equivalents may be referred to herein as "a means for reducing wander of the AC coupler."

Amplifier 230, in one embodiment, is configured to amply the differential voltage of the differential input signal after AC coupler 220 processes the signal. In various embodiments, amplifier 230 is configured for differential input signals that have a particular common-mode voltage. As noted above, in various embodiments, AC coupler 220 is configured to shift a common-mode voltage of a differential input signal to that particular common-mode voltage. For example, in one embodiment, amplifier may be configured for differential input signals that have a common-mode voltage of 0.5 V. If a differential input signal is received that has a common-mode voltage of 0 V, AC computer may be configured to shift this common-mode voltage to 0.5 V.

Sampler 240, in one embodiment, is configured to quantize the output of amplifier 230 to generate a digital signal for digital backend 206. In one embodiment, sampler 240 includes multiple slicers configured to quantize the output of amplifier 230 with separate threshold voltages, $V_{th0}$, $V_{th1}$, ... $V_{thN}$. In one embodiment, sampler 240 may be configured to use a sampling clock generated by a clock recovery module (e.g., in digital backend 206), which is configured to extract the recovered clock with the correct frequency and phase based on the output of sampler 240.

Figure 3:
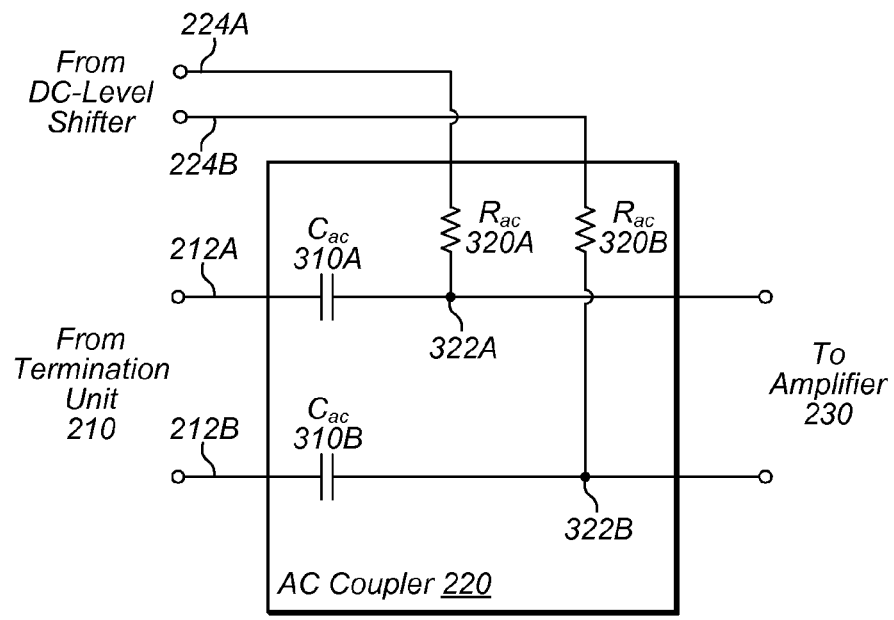
FIG. 3 is a block diagram illustrating one embodiment of an AC coupler included in the receiver.

Turning now to FIG. 3, a diagram of AC coupler 220 is depicted. As noted above, AC coupler 220, in one embodiment, is configured to shift a common-mode voltage of a differential input signal. In the illustrated embodiment, AC coupler 220 includes capacitors $C_{AC}$ 310A and 310B and resistors $R_{AC}$ 320A and 320B. Capacitors 310A and 310B are respectively coupled to nodes 212A and 212B and to resistors 320A and 320B via nodes 322A and 322B. Resistors 320A and 320B are respectively coupled to lines 224A and 224B.

In the illustrated embodiment, capacitors 310 and resistors 320 form an RC circuit that is configured to high-pass filter a differential signal passing from nodes 212 through capacitors 310. The RC circuit may also be configured to low-pass filter a differential reference signal received from DC-level shifter via lines 224 with the same corner frequency used in the high-pass filtering. In the illustrated embodiment, the low-pass-filtered reference signal and high-pass-filtered signal are combined at nodes 322 to produce a differential output signal that has a shifted common-mode voltage and that experiences less low-frequency loss and thus less wander.

Figure 4:
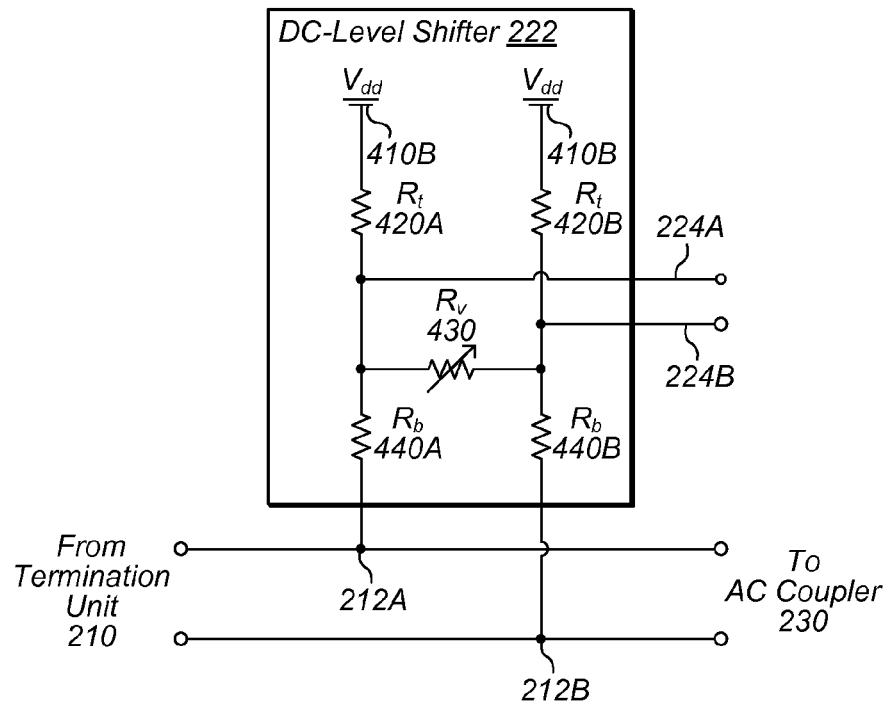
FIG. 4 is a block diagram illustrating one embodiment of a DC-level shifter in the receiver.

Turning now to FIG. 4, a diagram of one embodiment of DC-level shifter 222 is depicted. As noted above, in various embodiments, DC-level shifter 222 is configured to reduce wander created by AC coupler 220. In the illustrated embodiment, DC-level shifter 222 includes voltage supplies $V_{dd}$ 410A and 410B, resistors $R_t$ 420A and 420B, tunable resistor $R_v$ 430, and resistors $R_b$ 440A and 440B. Voltage supplies 410A and 420B are respectively coupled to resistors 420, which, in turn, are respectively coupled to lines 224A and 224B, resistor 430, and resistors 440A and 440B. Resistors 420 and resistors 440 may be referred to herein as a resistor divider network.

In one embodiment, DC-level shifter 222 is configured to use the resistor divider network to output a differential reference signal via lines 224 (e.g., having voltages of $V_{cp}$ and $V_{en}$) and created from the differential input signal at nodes 212. In one embodiment, the common-mode voltage of the reference signal (e.g., $(V_{cp}+V_{cn})/2$) is determined by the supply voltage ($V_{dd}$) of voltage supplies 410 and the resistor divider as $V_{dd}*R_t/(R_b+R_t)$. Thus, the common-mode voltage of the reference signal may increased or decreased by increasing or decreasing the ratio of $R_t$ to $R_b$, respectively. In some embodiments, this relation holds as long as the resistance of $R_t$ and $R_b$ is far larger than the receiver input impedance (e.g., 50Ω in one embodiment), and the input common-mode voltage is zero, which may be true for PCIe 3.0 for example. Consequently, the common mode voltage of AC coupler 220, which may be the same as the common-mode voltage of the reference signal, can be chosen by sizing the two resistors ($R_t$ and $R_b$).

In the illustrated embodiment, DC-level shifter 222 is configured to use tunable resistor 430 to adjust the differential voltage of the reference signal. Without tunable resistor 430, the differential gain of DC-level shifter 222 may be the same as the common-mode gain, which allows the DC (or very low-frequency) signal, which is blocked by AC coupler 220, to pass through with some attenuation. In the illustrated embodiment, such a DC signal finally appears at the output of AC coupler 220 through resistors 320 after it is low-pass filtered with the corner frequency of AC coupler 220. As a result, the high-frequency energy that is greater than the AC corner frequency goes through capacitors 310, while the energy that is less than the corner frequency takes the path of DC-level shifter 222 and resistors 320 to compensate for DC loss of AC coupler 230. In various embodiments, the bandwidth of DC-level shifter 222 is chosen well above the corner frequency of AC coupler 230 to ensure no observable attenuation is introduced. To match with the gain of the linear equalizer, tunable resistor 430, in some embodiments, is included in DC-level shifter 222 to vary its differential gain ($K_{dc}$) as:

$$K_{dc} = \frac{R_t \| R_v}{(R_t \| R_v) + R_b} \quad (1)$$

Accordingly, the DC gain may be set by the resistor ratio; thus no calibration/compensation is needed for the DC gain control, and the DC gain control does not introduce additional DC offset. In some embodiments, DC-level shifter 222 is configured to match this gain with a low-frequency of an equalizer by matching the resistor ratio (in the DC path) with the capacitor ratio in the equalizer. Embodiments of an equalizer are described below in conjunction with FIGS. 7A and 7B.

In some instances, it may be desirable to shift the common-mode voltage of the differential input signal to a voltage that exceeds a maximum voltage that can be provided by the resistor network in DC-level shifter 222—e.g., due to the voltage being provided by voltage supplies 410 or a desired ratio of resistors 420 and 440. To shift the common-mode voltage of the differential input signal to a voltage above this limit, DC-level shifter 222, in some embodiments, may include current sources or an amplifier such as those described next in conjunction with FIGS. 5 and 6.

Figure 5:
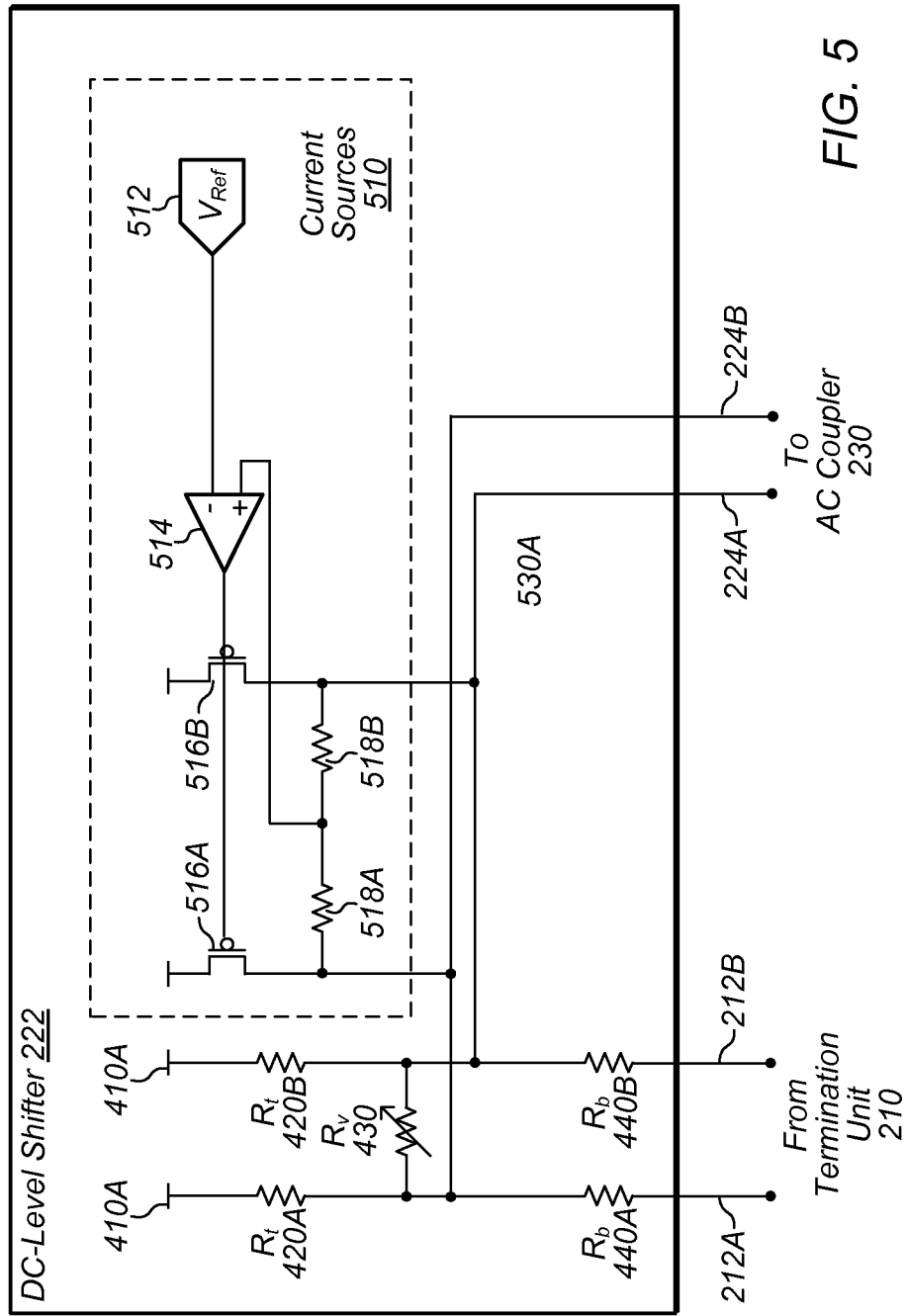
FIG. 5 is a block diagram illustrating another embodiment of the DC-level shifter.

Turning now to FIG. 5, a diagram of another embodiment of DC-level shifter 222 is depicted. In the illustrated embodiment, DC-level shifter 222 includes two current sources 510 in addition to voltage supplies 410, resistors 420, resistor 430, and resistors 440. In various embodiments, current sources 510 are configured to supply current to increase the common-mode voltage of a differential input signal to create a differential reference signal. In the illustrated embodiment, current sources 510 include a voltage reference 512 (to set the common-mode voltage), operational amplifier 514, positive-type metal-oxide-semiconductor field-effect transistors (pMOS-FETs) 516A and 516B, and resistors 518A and 518B. In one embodiment, amplifier 514, pMOSFET 516A, and resistor 518A may be considered as being part of a first current source configured to provide current on line 224B. Amplifier 514, pMOSFET 516B, and load resistor 518B may be considered as being part of a second current source configured to provide current on line 224A.

Figure 6:
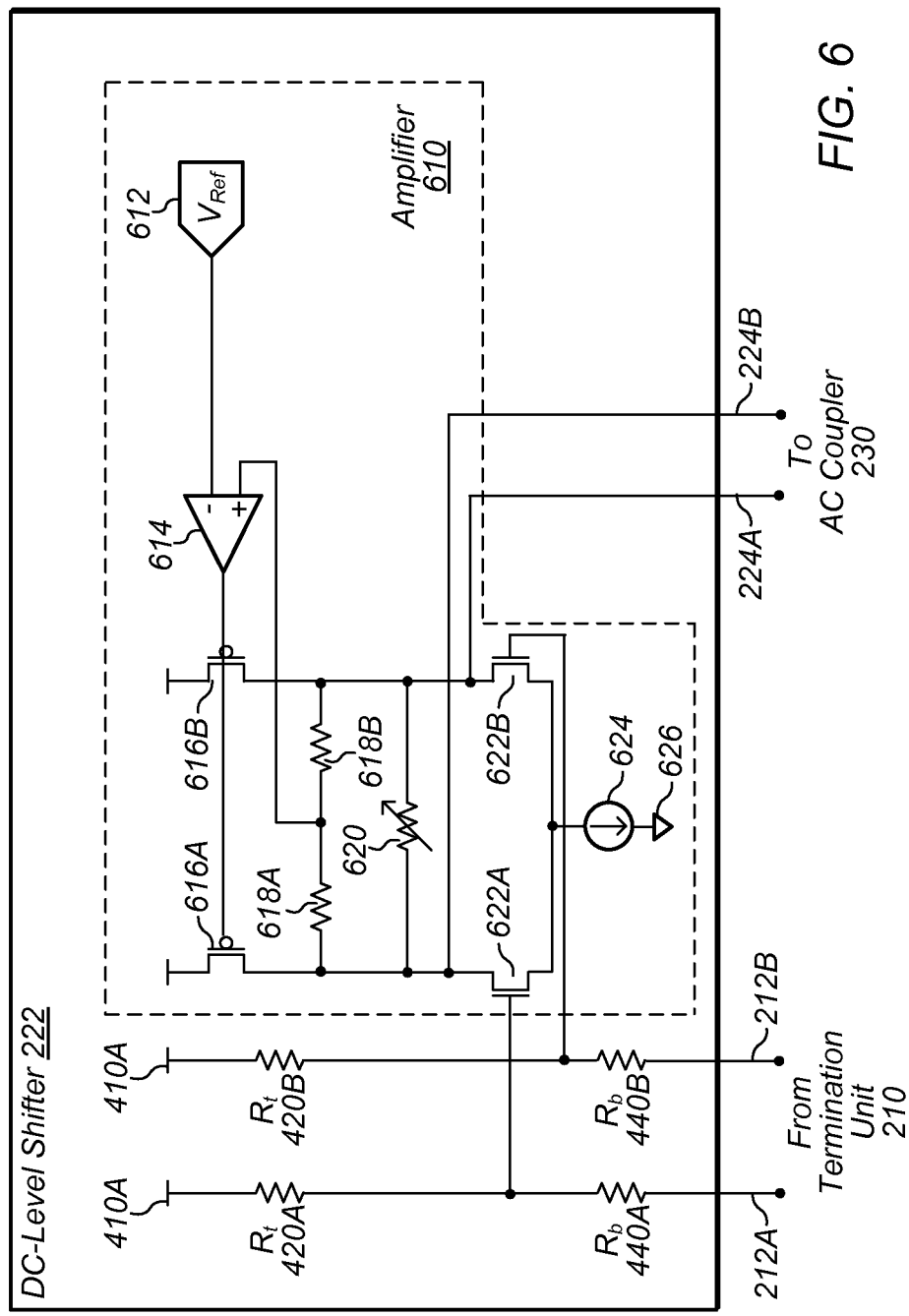
FIG. 6 is a block diagram illustrating yet another embodiment of the DC-level shifter.

Turning now to FIG. 6, a diagram of another embodiment of DC-level shifter 222 is depicted. In the illustrated embodiment, DC-level shifter 222 includes amplifier 610 in addition to voltage supplies 410, resistors 420, and resistors 440. In various embodiments, amplifier 610 is configured to increase the common-mode voltage of a differential input signal to create a differential reference signal. In the illustrated embodiment, amplifier 610 includes a voltage reference 612, operational amplifier 614, pMOSFETs 616A and 616B, resistors 618A and 618B, tunable resistor 620, negative-type MOSFETs (nMOSFETs) 622A and 622B, current source 624, and ground supply 626. In one embodiment, tunable resistor 620 may be adjusted to change the differential voltage of the reference signal in a similar manner as resistor 430 described above.

Figure 7A:
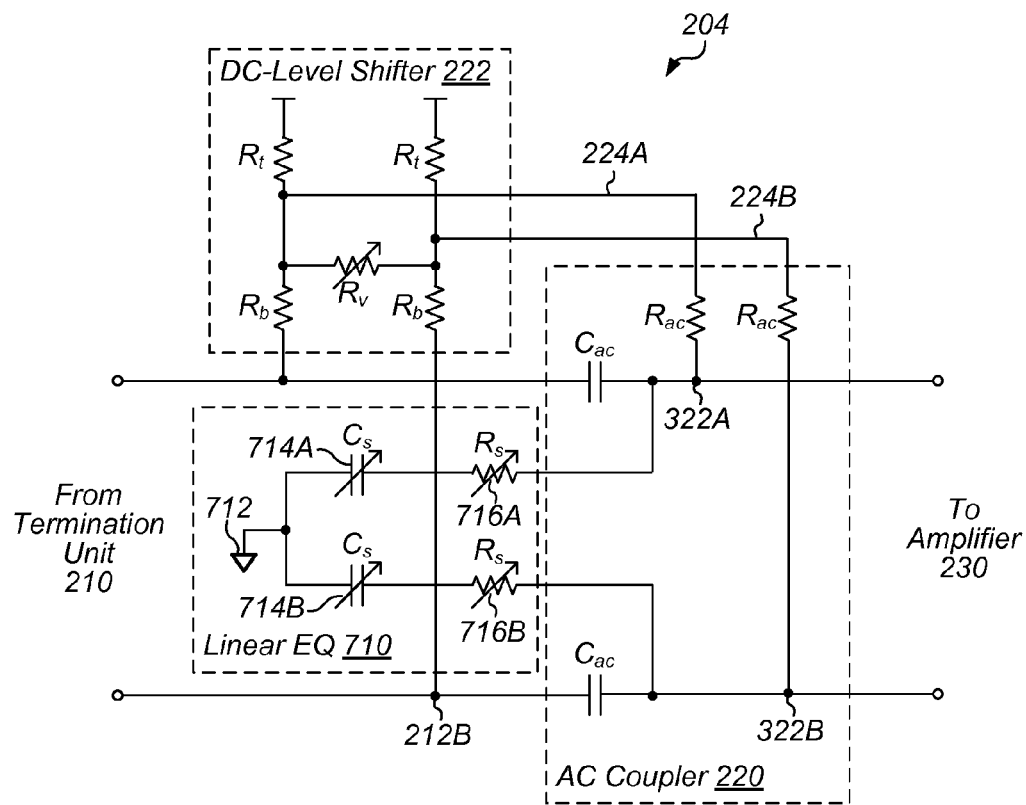
FIG. 7A is a block diagram illustrating one embodiment of an analog frontend that includes a linear equalizer.

Turning now to FIG. 7A, a diagram of one embodiment of analog frontend 204 that includes a linear equalizer is depicted. To compensate for high-frequency channel loss, analog frontend 204, in some embodiments, includes an analog equalizer that has a lower gain in the low-frequency range and a higher gain in the high-frequency range. In the illustrated embodiment, analog frontend 204 includes linear equalizer 710, which includes a ground supply 712, capacitors $C_s$ 714A and 714B and resistors $R_s$ 716A and 716B. Ground supply 712 is coupled to capacitors 714A and 714B, which, in turn, are respectively coupled to resistors 716A and 716B. Resistors 716A and 716B are coupled to nodes 322A and 322B respectively.

In one embodiment, linear equalizer 710 is configured to equalize the differential input signal with a high linearity. In many instances, high linearity may be desired because of the wide-swing signal at receiver 200's input. In various embodiments, an AC-coupled passive equalizer, such as equalizer 710, is proposed to maintain the AC coupling characteristic of analog frontend 204. In the illustrated embodiment, equalizer 710 has two tunable components, capacitors 714 and resistors 716.

In one embodiment, equalizer 710 may be configured to function as a filter with one zero and one pole, and has a unit gain at high frequencies while the low-frequency gain $K_{LF}$ is determined by the ratio of the capacitors as:

$$K_{LF} = \frac{C_{ac}}{C_{ac} + C_s} \quad (2)$$

Accordingly, linear equalizer 710 may be configured to tune its gain at low frequencies by tuning capacitors 714. For example, in one embodiment, a 6 dB attenuation in the low frequency can be achieved by choosing capacitors 714 equal to capacitors 310, and a 12 dB attenuation by choosing capacitors 714 to be three times capacitors 310.

Resistors 320, which, in some embodiments, may be larger than resistors 716 and used to set the DC voltage of the AC-coupler output, are ignored in the above calculation. In fact, they may introduce an additional zero at DC and an additional pole at the AC-coupling corner frequency ($f_c$):

$$f_c = \frac{1}{2\pi(C_s + C_{ac})R_{ac}} [\text{Hz}] \quad (3)$$

Figure 7B:
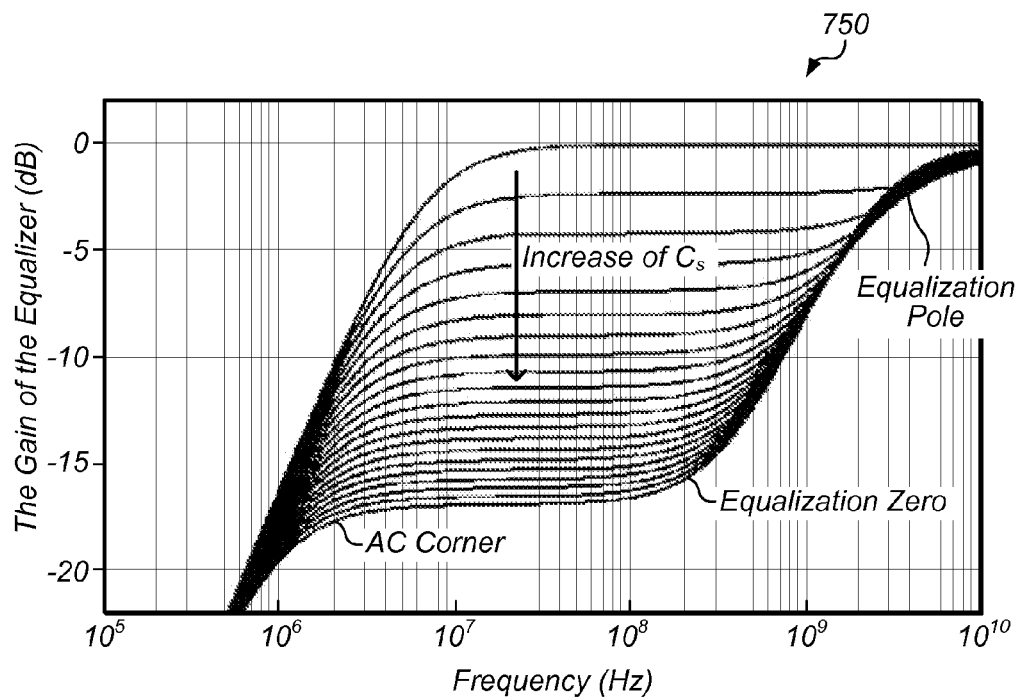
FIG. 7B is an exemplary graph of a frequency response of the linear equalizer when DC wander compensation is disabled.

As shown in Eq. 3, the corner frequency moves toward DC with the increase of Cs. FIG. 7B is a graph 750 illustrating a frequency response for one embodiment of equalizer 710 as capacitors $C_s$ 714 are turned and resistors $R_s$ 716 are fixed. In one embodiment, equalizer 710 may employ a thermometer for turning capacitors 714 to achieve a better differential linearity. The low-frequency gain may be reduced with the increase of capacitors 714. As analyzed above, the pole location may remain almost constant while capacitors 714 are tuned.

In various embodiments, for channels with higher loss at high frequencies, the low-frequency gain of equalizer 710 may be lower, or the equalization strength (the difference between the high-frequency gain and the low-frequency gain) may be higher. In some embodiments, the tuning step size is smaller for higher equalization strength to compensate the channel loss more precisely. In addition, the AC corner frequency may be lower for higher equalization to reduce the impact of DC wander.

The performance of some embodiments of analog frontend 204 is described below in conjunction with FIGS. 8A-8C.

Figure 8A:
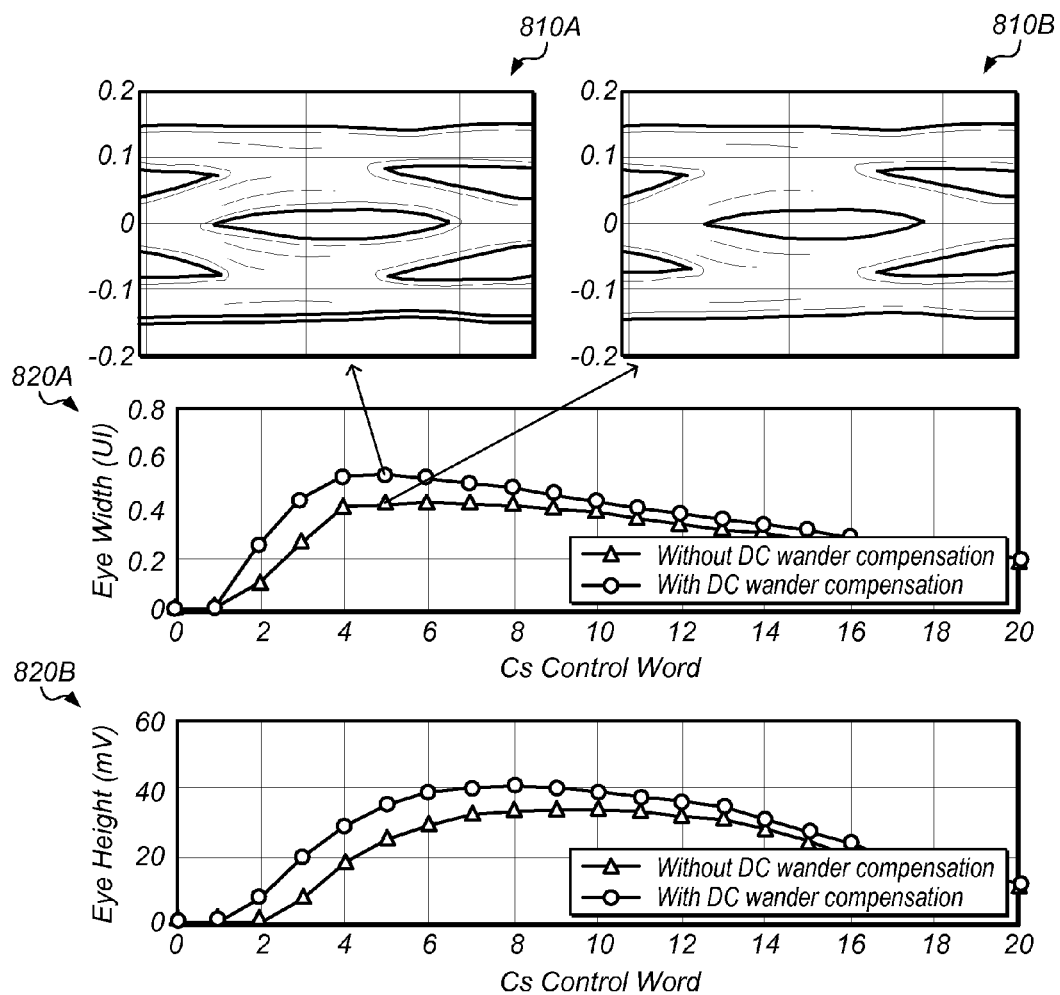
FIGS. 8A-C are a set of exemplary graphs illustrating DC wander compensation.

Turning now to FIG. 8A, a pair of exemplary eye diagrams 810A and 810B and a corresponding pair of exemplary graphs 820A and 820B are depicted. Eye diagram 810A is an eye diagram for one embodiment of analog frontend 204 when DC wander compensation is being used (e.g., DC-level shifter 222 is enabled). Eye diagram 810B is an eye diagram for one embodiment of analog frontend 204 when DC wander compensation is not being used (e.g., DC-level shifter 222 is disabled). As shown, receiver 200's eye diagram 810A has a greater eye height and eye width than eye diagram 820B. In exemplary graph 820A, the maximum eye width happens at the $C_s$ control code of 5. The eye width with or without the DC wander compensation is 0.53 UI, or 0.42 UI separately. While the eye height, in exemplary graph 820B, at the same setting is 35 mV or 25 mV for the case when DC wander compensation is enabled or disabled. In many instances, the eye may be completely closed at the receiver input, and opened with the proposed equalization scheme. In exemplary graphs 820A and 820B, usage of DC wander compensation shows an improvement of 0.11 UI on the eye width and 10 mV on the eye height.

Figure 8B:
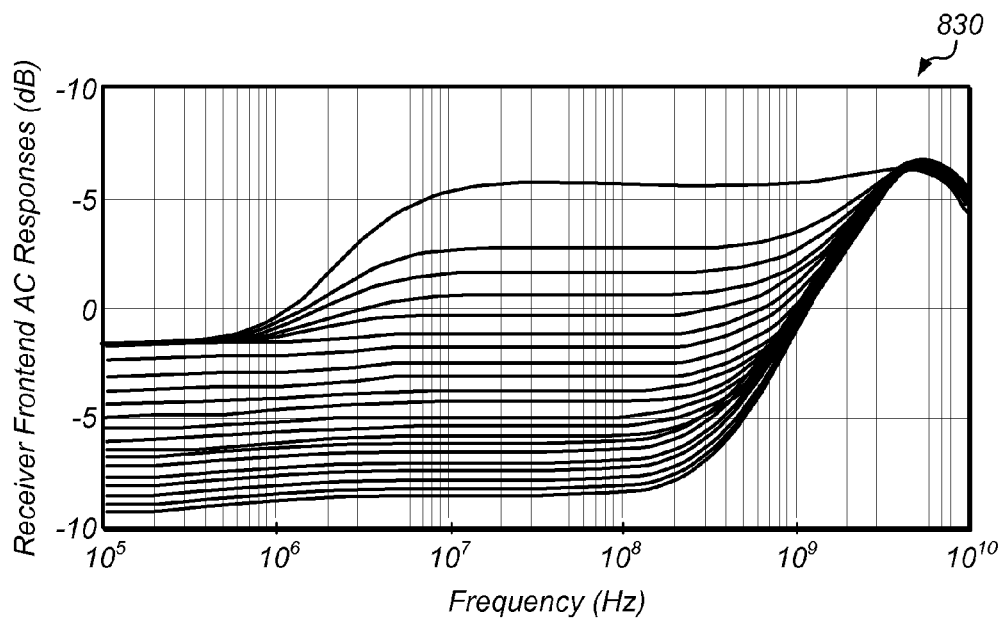
Figure 8C:
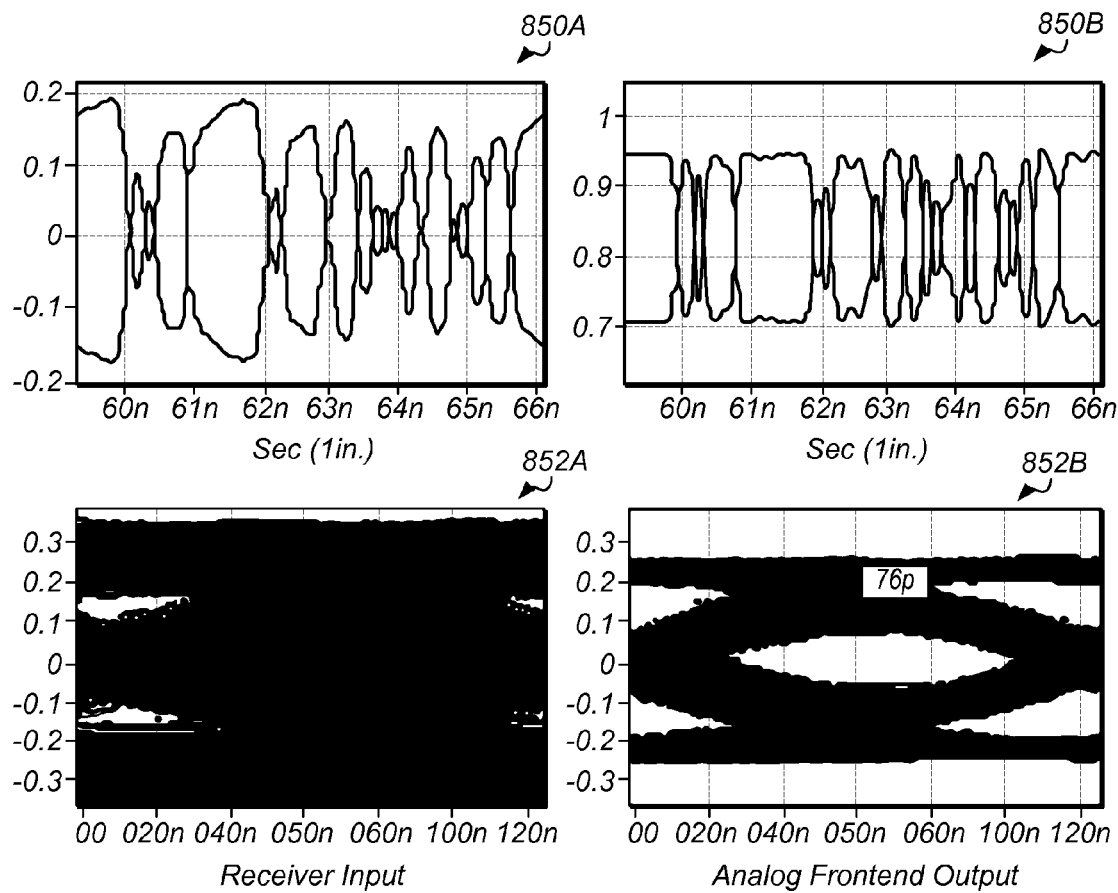

Turning now to FIG. 8B, a graph 830 illustrating exemplary frequency responses of analog frontend 204 is depicted. To generate graph 830, an Hspice simulation was performed for one embodiment of analog frontend 204 that was implemented in a 32-nm silicon-on-insulator (SOI) process and that includes linear equalizer 710, DC-level shifter 222, and a two-stage amplifier. Graph 830 illustrates different responses generated by fixing the resistance of resistors $R_s$ 716 in linear equalizer 710 and changing the capacitance of capacitors $C_s$ 714 (e.g., sweeping the $C_s$ control word). In the illustrated embodiment, there are multiple poles at high-frequency roll-off due to the band-limited amplifiers after the linear equalizer. Comparing to the results shown in FIG. 7B, a matched DC gain (which, in one embodiment, is approximately 0.5 dB lower than the low-frequency gain of the equalizer) may be maintained for an equalization strength that is greater than 7 dB. In the illustrated embodiment, analog frontend 204 may be configured to keep a constant DC gain for the equalization strength lower than 7 dB, which corresponds to short channels insensitive to small DC wander.

In exemplary graph 830, an 8 Gbps PRBS11 signal, generated using a transmitter model with a one-tap de-emphasis of 6 dB and gone through a 20-inch channel model and the package model, was used as the receiver input signal to test frontend 204 in Hspice. The linear equalization pole was set to approximately 2 GHz, while the equalization strength was swept by changing the Cs control word to find the optimum Cs control word, which results in a maximum eye width at analog frontend 204's output. FIG. 8C shows one embodiment of a time-domain waveform 850A and an eye diagram 852A of the receiver input and a time-domain waveform 850B and an eye diagram 852B of frontend 204's output.

With the proposed schemes, the receiver analog frontend 204, in one embodiment, is configured to equalize the high frequency loss and to produce the output with the eye width of 79 ps (0.63 UI), while the input has a completely closed eye.

Figure 9:
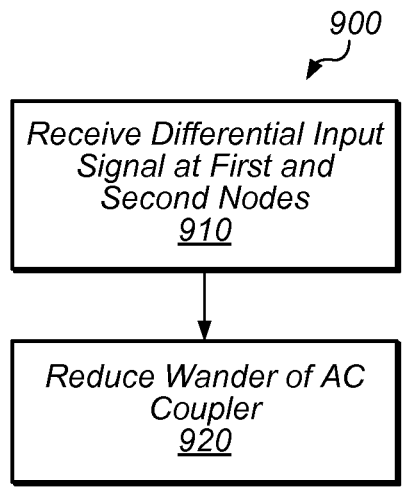
FIG. 9 is a flow diagram illustrating one embodiment of a method for the receiver.

Turning now to FIG. 9, a flow diagram of a method 900 is depicted. Method 900 is one embodiment of a method that may be performed by a receiver, such as receiver 200, to compensate for DC wander caused by an AC coupler, such as AC coupler 230. In some instances, performing method 900 may improve receiver performance by increasing a receiver's eye height and eye width.

In step 910, an AC coupler (e.g., AC coupler 220) of receiver 200 receives a differential input signal at first and second nodes (e.g., nodes 212A and 212B). In some embodiments, the differential input signal may be provided by a termination unit (e.g., termination unit 210) of receiver 200. In one embodiment, the AC coupler shifts a common-mode voltage of the differential input signal by high-pass filtering the differential input signal (e.g., using capacitors 310 and resistors 320). In some embodiments, the shifted common-mode voltage is a common-mode voltage supported by an amplifier (e.g., amplifier 230) that amplifies the output signal of the AC coupler.

In step 920, receiver 200 reduces wander of the AC coupler. In one embodiment, a DC-level shifter reduces the wander by supply a differential reference signal (e.g., via lines 224A and 224B) to the AC coupler. In one embodiment, the DC-level shifter creates the differential reference signal from the differential input signal at the first and second nodes by changing a common-mode voltage of the differential input signal. In various embodiments, the DC-level shifter includes a resistor divider network (e.g., resistors 420 and 440) to change the common-mode voltage of the differential input signal. In some embodiments, the DC-level shifter also includes first and second current sources (e.g., current sources 510) that supply current to increase the common-mode voltage of differential input signal to create the differential reference signal. In some embodiments, the DC-level shifter includes an amplifier (e.g., amplifier 610) that increases the common-mode voltage of the differential input signal to create the differential reference signal. In one embodiment, the AC coupler low-pass filters (e.g., using resistors 320 and capacitors 310) the differential reference signal, and adds (e.g., at nodes 322) the low-pass-filtered differential reference signal to a high-pass-filtered form of the differential input signal. In various embodiments, the DC-level shifter and the AC coupler form a feedforward path (e.g., from nodes 212 through nodes 322).

In one embodiment, the receiver includes a linear equalizer (e.g., equalizer 710) to equalize the differential input signal. In one embodiment, the receiver matches a gain of the DC-level shifter with a low-frequency gain of the linear equalizer. In some embodiments, the receiver adjusts a resistance (e.g., using resistor 430) in the DC-level shifter to match the gain of the DC-level shifter with the low-frequency gain of the linear equalizer.

Exemplary Computer System

Figure 10:
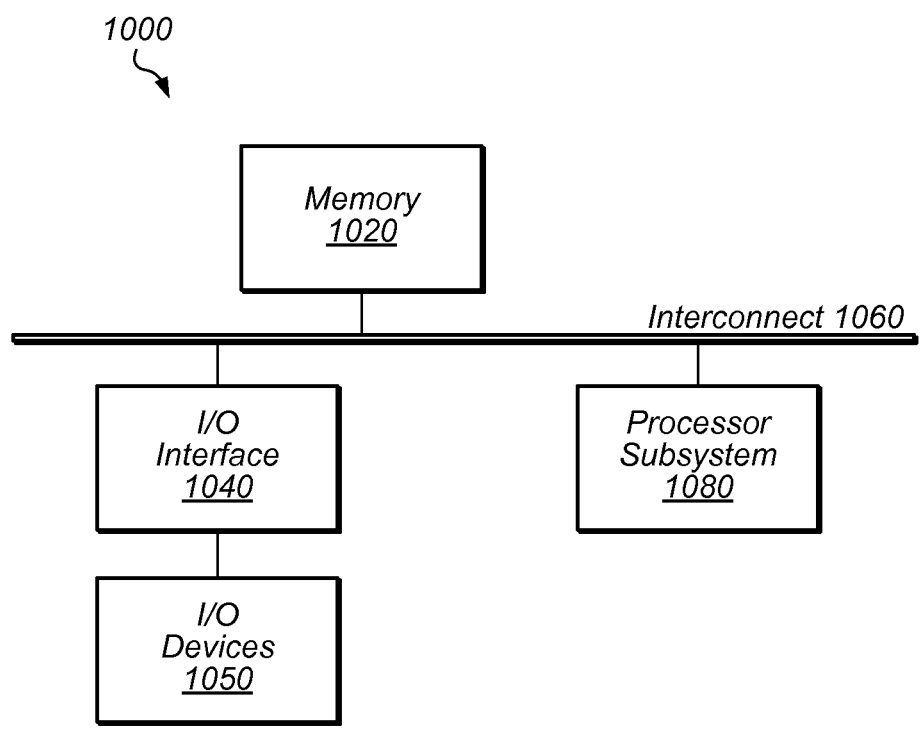
FIG. 10 is a block diagram illustrating one embodiment of an exemplary computer system.

Turning now to FIG. 10, one embodiment of an exemplary computer system 1000, which may include one or more instances of receiver 200, is depicted. (Embodiments of receiver 200 may also be included in devices other than computer systems.) Computer system 1000 includes a processor subsystem 1080 that is coupled to a system memory 1020 and I/O interfaces(s) 1040 via an interconnect 1060 (e.g., a system bus). I/O interface(s) 1040 is coupled to one or more I/O devices 1050. Computer system 1000 may be any of various types of devices, including, but not limited to, a server system, personal computer system, desktop computer, laptop or notebook computer, mainframe computer system, handheld computer, workstation, network computer, a consumer device such as a mobile phone, pager, or personal data assistant (PDA). Computer system 1000 may also be any type of networked peripheral device such as storage devices, switches, modems, routers, etc. Although a single computer system 1000 is shown for convenience, system 1000 may also be implemented as two or more computer systems operating together.

Processor subsystem 1080 may include one or more processors or processing units. For example, processor subsystem 1080 may include one or more processing units (each of which may have multiple processing elements or cores) that are coupled to one or more resource control processing elements 1020. In various embodiments of computer system 1000, multiple instances of processor subsystem 1080 may be coupled to interconnect 1060. In various embodiments, processor subsystem 1080 (or each processor unit or processing element within 1080) may contain a cache or other form of on-board memory. In one embodiment, processor subsystem 1080 may include one or more instances of receiver 200 described above.

System memory 1020 is usable by processor subsystem 1080. System memory 1020 may be implemented using different physical memory media, such as hard disk storage, floppy disk storage, removable disk storage, flash memory, random access memory (RAM—static RAM (SRAM), extended data out (EDO) RAM, synchronous dynamic RAM (SDRAM), double data rate (DDR) SDRAM, RAMBUS RAM, etc.), read only memory (ROM—programmable ROM (PROM), electrically erasable programmable ROM (EEPROM), etc.), and so on. Memory in computer system 1000 is not limited to primary storage such as memory 1020. Rather, computer system 1000 may also include other forms of storage such as cache memory in processor subsystem 1080 and secondary storage on I/O Devices 1050 (e.g., a hard drive, storage array, etc.). In some embodiments, these other forms of storage may also store program instructions executable by processor subsystem 1080.

I/O interfaces 1040 may be any of various types of interfaces configured to couple to and communicate with other devices, according to various embodiments. In one embodiment, I/O interface 1040 is a bridge chip (e.g., Southbridge) from a front-side to one or more back-side buses. I/O interfaces 1040 may be coupled to one or more I/O devices 1050 via one or more corresponding buses or other interfaces. Examples of I/O devices include storage devices (hard drive, optical drive, removable flash drive, storage array, SAN, or their associated controller), network interface devices (e.g., to a local or wide-area network), or other devices (e.g., graphics, user interface devices, etc.). In one embodiment, computer system 1000 is coupled to a network via a network interface device. In some embodiments, I/O interfaces 1040 may include one or more instances of receiver 200.

Program instructions that are executed by computer systems (e.g., computer system 1000) may be stored on various forms of computer readable storage media. Generally speaking, a computer readable storage medium may include any non-transitory/tangible storage media readable by a computer to provide instructions and/or data to the computer. For example, a computer readable storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

In some embodiments, a computer-readable storage medium can be used to store instructions read by a program and used, directly or indirectly, to fabricate hardware for receiver 200 described above. For example, the instructions may outline one or more data structures describing a behavioral-level or register-transfer level (RTL) description of the hardware functionality in a high level design language (HDL) such as Verilog or VHDL. The description may be read by a synthesis tool, which may synthesize the description to produce a netlist. The netlist may comprise a set of gates (e.g., defined in a synthesis library), which represent the functionality of receiver 200. The netlist may then be placed and routed to produce a data set describing geometric shapes to be applied to masks. The masks may then be used in various semiconductor fabrication steps to produce a semiconductor circuit or circuits corresponding to receiver 200.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An integrated circuit, comprising:
    an AC coupler configured to receive a differential input signal at first and second nodes, wherein the AC coupler is configured to shift a common-mode voltage of the differential input signal;
    a DC-level shifter, wherein the DC-level shifter includes a resistor divider network coupled to the first and second nodes and to a voltage supply, wherein the DC-level shifter is configured to reduce wander of the AC coupler; and
    wherein the DC-level shifter and the AC coupler form a feedforward path.

2. The integrated circuit of claim 1, wherein the DC-level shifter is configured to supply a differential reference signal to the AC coupler, wherein the DC-level shifter is configured to create the differential reference signal from the differential input signal at the first and second nodes by changing a common-mode voltage of the differential input signal.

3. The integrated circuit of claim 2, wherein the AC coupler is configured to low-pass filter the differential reference signal, and to add the low-pass-filtered differential reference signal to a high-pass-filtered form of the differential input signal.

4. The integrated circuit of claim 2, wherein the resistor divider network is configured to change the common-mode voltage of the differential input signal.

5. The integrated circuit of claim 2, wherein the DC-level shifter includes first and second current sources configured to supply current to increase the common-mode voltage of differential input signal to create the differential reference signal.

6. The integrated circuit of claim 2, wherein the DC-level shifter includes an amplifier configured to increase the common-mode voltage of the differential input signal to create the differential reference signal.

7. The integrated circuit of claim 1, further comprising:
    a linear equalizer coupled to the AC coupler;
    wherein the apparatus is configured to match a gain of the DC-level shifter with a low-frequency gain of the linear equalizer.

8. The integrated circuit of claim 7, wherein the apparatus is configured to adjust resistance in the DC-level shifter to match the gain of the DC-level shifter with the low-frequency gain of the linear equalizer.

9. An apparatus, comprising:
    a receiver configured to use an AC coupler to high-pass filter a differential input signal;
    wherein the receiver is configured to use a DC-level shifter to compensate for wander of the AC coupler by adding a filtered differential reference signal to the high-pass-filtered differential input signal to produce a differential output signal, wherein DC-level shifter includes a resistor divider network coupled to the AC coupler; and
    wherein the DC-level shifter and the AC coupler form a feedforward path.

10. The apparatus of claim 9, wherein the DC-level shifter is configured to create the filtered differential reference signal by shifting a common-mode voltage of the differential input signal and low-pass filtering the differential input signal.

11. The apparatus of claim 10, wherein the receiver is configured to use an amplifier to amply the differential output signal, and wherein the common-mode voltage is a common-mode voltage supported by the amplifier.

12. The apparatus of claim 10, wherein the resistor divider network is configured to shift the common-mode voltage of the differential input signal.

13. The apparatus of claim 9, wherein the receiver is configured to low-pass filter the differential input signal by using a resistor capacitor (RC) circuit.

14. The apparatus of claim 9, wherein the receiver includes a linear equalizer configured to equalize the differential input signal, and wherein the receiver is configured to create the filtered differential reference signal by adjusting a differential voltage of the differential input signal based on a low-frequency gain of the linear equalizer.

15. The apparatus of claim 9, wherein the receiver is configured to communicate via a PCI Express standard.

16. A method, comprising:
    an AC coupler of a receiver high-pass filtering a differential input signal;
    a DC-level shifter of the receiver reducing wander created by the AC coupler by adding, to the high-pass-filtered differential input signal, a low-pass-filtered form of the differential input signal that has a shifted common-mode voltage, wherein the reducing includes a resistor divider network of the DC-level shifter shifting the common-mode voltage of the differential input signal to create the low-pass-filtered form of the differential input signal; and wherein the DC-level shifter and the AC coupler form a feedforward path.

17. The method of claim 16, further comprising:
the receiver changing a differential voltage of the differential input signal to create the low-pass-filtered form of the differential input signal, wherein the differential voltage is changed based on a low-frequency gain of a linear equalizer in the receiver.

18. An apparatus, comprising:
an AC coupler configured to receive a differential input signal at first and second nodes, and to shift a common-mode voltage of a differential input signal; and
a means for reducing wander of the AC coupler, wherein the means for reducing wander includes a resistor divider network; and
wherein the means for reducing wander and the AC coupler form a feedforward path.

19. The apparatus of claim 18, further comprising:
a linear equalizer coupled to the AC coupler, wherein the linear equalizer is configured to equalize the differential input signal.

20. A non-transitory computer readable medium comprising a data structure which is operated upon by a program executable on a computer system, the program operating on the data structure to perform a portion of a process to fabricate an integrated circuit including circuitry described by the data structure, the circuitry described by the data structure including:
an AC coupler configured to receive a differential input signal at first and second nodes, wherein the AC coupler is configured to shift a common-mode voltage of the differential input signal;
a DC-level shifter, wherein the DC-level shifter includes a resistor divider network coupled to the first and second nodes and to a voltage supply, wherein the DC-level shifter is configured to reduce wander of the AC coupler; and
wherein the DC-level shifter and the AC coupler form a feedforward path.

21. The computer readable medium of 20, wherein the storage medium stores hardware description language (HDL) data, Verilog data, or graphic database system II (GDSII) data.

* * * * *